(12) United States Patent
Ohtani et al.

(10) Patent No.: US 6,232,156 B1
(45) Date of Patent: May 15, 2001

(54) METHOD OF MANUFACTURING A SEMICONDUCTOR DEVICE

(75) Inventors: Hisashi Ohtani; Akiharu Miyanaga; Junichi Takeyama, all of Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/059,563

(22) Filed: Apr. 14, 1998

Related U.S. Application Data

(62) Division of application No. 08/688,228, filed on Jul. 29, 1996, now Pat. No. 5,904,770, which is a continuation of application No. 08/377,938, filed on Jan. 25, 1995, now abandoned.

(30) Foreign Application Priority Data

Feb. 3, 1994 (JP) .................................................. 6-31824

(51) Int. Cl.[7] .............................. H01L 21/00; H01L 21/20
(52) U.S. Cl. ......................... 438/151; 438/152; 438/156; 438/166; 438/482
(58) Field of Search ................................... 438/151, 152, 438/166, 156, 486, 528, 532

(56) References Cited

U.S. PATENT DOCUMENTS

| | | |
|---|---|---|
| 4,727,044 | 2/1988 | Yamazaki . |
| 5,147,826 | 9/1992 | Liu et al. . |

(List continued on next page.)

FOREIGN PATENT DOCUMENTS

| | | |
|---|---|---|
| 0 390 608 | 10/1990 | (EP) . |
| 0 486 019 | 5/1992 | (EP) . |
| 61-058879 | 3/1986 | (JP) . |
| 61-63017 | 4/1986 | (JP) . |
| 63-142807 | 6/1988 | (JP) . |
| 2-140915 | 5/1990 | (JP) . |
| 2-260521 | 10/1990 | (JP) . |
| 2-260524 | 10/1990 | (JP) . |
| 3-70123 | 3/1991 | (JP) . |

(List continued on next page.)

OTHER PUBLICATIONS

"The Principle of Thin Film Deposition", VLSI Fabrication Technology, pp. 147–148, (with English language translation) (Date Unknown).

R. Kakkad, et al., "Crystallized Si Films by Low–Temperature Rapid Thermal Annealing of Amorphous Silicon," J. Appl. Phys. 65(5), Mar. 1, 1989, pp. 2069–2072.

C. Hayzelden, et al., "In Situ Transmission of Electron Microscopy Studies of Silicide–Mediated Crystallization of Amorphous Silicon," (3). No date given.

T. Hempel, et al., "Needle–Like Crystallization of Ni Doped Amorphous Silicon Thin Films," Solid State Communications, vol. 85, No. 11, pp. 921–924, 1993. No month given.

G. Liu, et al., "Polycrystalline Silicon Thin Film Transistors On Corning 7059 Glass Substrates Using Short Time, Low–Temperature Processing," Appl. Phys. Lett. 62 (20), May 17, 1993, 2554–2556.

(List continued on next page.)

Primary Examiner—Vu A. Le
Assistant Examiner—Michael S. Lebentritt
(74) Attorney, Agent, or Firm—Eric J. Robinson; Nixon Peabody LLP

(57) ABSTRACT

A method of manufacturing a semiconductor device which has a crystalline silicon film comprises the steps of forming crystal nuclei in a surface region of an amorphous silicon film and then growing the crystals from the nuclei by a laser light. Typically the crystal nuclei are silicon crystals or metal silicides having an equivalent structure as silicon crystal.

15 Claims, 6 Drawing Sheets

U.S. PATENT DOCUMENTS

| | | |
|---|---|---|
| 5,275,851 | 1/1994 | Fonash et al. . |
| 5,385,863 | 1/1995 | Tatsumi et al. . |
| 5,403,772 | 4/1995 | Zhang et al. . |
| 5,426,064 | 6/1995 | Zhang et al. . |
| 5,531,182 | 7/1996 | Yonehara . |
| 5,580,381 | 12/1996 | Yamagata . |
| 5,587,330 * | 12/1996 | Yamazaki ................................ 437/41 |
| 5,923,997 * | 7/1999 | Mitanaga et al. .................... 438/486 |
| 5,985,704 * | 11/1999 | Adachi et al. ........................ 438/166 |

FOREIGN PATENT DOCUMENTS

| | | |
|---|---|---|
| 3-78123 | 3/1991 | (JP) . |
| 3-280420 | 12/1991 | (JP) . |
| 4-022120 | 1/1992 | (JP) . |
| 4-180219 | 6/1992 | (JP) . |
| 4-352355 | 12/1992 | (JP) . |
| 5-82442 | 4/1993 | (JP) . |

OTHER PUBLICATIONS

Liu, et al., "Selective Area Crystallization of Amorphous Silicon Films by Low–Temperature Rapid Thermal Annealing," Appl. Phys. Lett. 55 (7), Aug. 14, 1989, pp. 660–662.

A.V. Dvurechenskii (a) et al., "Transport Phenomena in Amorphous Silicon Doped by Ion Implantation of 3D Metals," Phys. Stat. Sol. (a), 95, 1986, pp. 635–640. No month given.

R. Kakkad, et al., "Low Temperature Selective Crystallization of Amorphous Silicon," Journal of Non–Crystalline Solids 115, (1989) pp. 66–68. No month given.

The Principle of Thin Film Deposition, VLSI Fabrication Technology, pp. 247–248 (with English translation) (Date Unknown).

Liu et al., "Polycrystalline Silicon Thin Film Transistors on Corning 7059 Glass Substrates Using Short Time, Low–Temperature Processing", May 17, 1993, pp. 2554–2556, Appl. Phys. Lett., vol. 62.

Liu et al., "Selective area Crystallization of Amorphous Silicon Films by Low–Temperature Rapid Thermal Annealing", Aug. 14, 1989, pp. 660–662, Appl. Phys. Lett., vol. 55.

Kakkad et al., "Crystallized Films by Low–Temperature Rapid Thermal Annealing of Amorphous Silicon", Mar. 1, 1989, pp. 2069–2072, J. Appl. Phys., vol. 65.

Kaddad et al., "Low Temperature Selective Crystallization of Amorphous Silicon", Jan. 1, 1989, pp. 66–68, Journal of Non–Crystalline Solids, vol. 115.

* cited by examiner

METHOD OF MANUFACTURING A SEMICONDUCTOR DEVICE

This application is a Divisional of Ser. No. 08/688,228 now U.S. Pat. No. 5,904,770, filed Jul. 29, 1996, which is a Continuation of Ser. No. 08/377,938, filed Jan. 25, 1995, now abandoned.

FIELD OF THE INVENTION

The present invention relates to a semiconductor device which has a crystalline semiconductor material and a method for manufacturing the same.

BACKGROUND OF THE INVENTION

Thin film transistors (TFTs) are known which utilize a thin film semiconductor formed on a substrate. The TFTs are utilized in integrated circuits, especially in an electro-optical device such as an active matrix type liquid crystal device as switching elements for each pixel or as driver elements in a peripheral circuit for driving active matrix elements.

Amorphous silicon films are readily available for TFTs. However, the electrical characteristics of amorphous silicon films are low. For this reason, it is desired to use semiconductor films having a crystallinity, that is, polycrystalline, microcrystalline silicon, monocrystalline semiconductor or the like.

As a method for forming silicon films having a crystallinity (crystalline silicon, hereinafter), it is known to deposit an amorphous silicon film first and then crystallize it by applying heat or light energy such as laser light.

However, in the case of using heat energy, it is necessary to heat a substrate to a temperature 600° C. or higher for more than 10 hours. For example, a Corning 7059 glass which is generally used as a substrate for an active matrix type liquid crystal device has a class distortion point of 593° C. Accordingly, the crystallization through such a high temperature heat treatment is not desirable for a glass substrate. On the other hand, a short pulse laser such as an excimer laser has an advantage that it does not cause a distortion in a glass substrate. However, the uniformity of device characteristics is not so good in the case of using a laser. The inventors of the present invention considered that this is because of a temperature distribution in a laser beam.

The inventors of the present invention investigated a method for promoting a heat crystallization and a method for reducing a dispersion (ununiformity) in a laser crystallization in order to solve the problems concerning a crystallization of an amorphous silicon as discussed above.

With respect to the heat crystallization, it has been confirmed by the inventors that an amorphous silicon film can be crystallized through a heat treatment at 550° C. for 4 hours by depositing a small amount of nickel, palladium, lead or the like on the silicon film.

As a method for introducing a small amount of the foregoing elements (i.e. a catalyst element for promoting crystallization), it is possible to use a plasma treatment, evaporation and ion implantation. The plasma treatment is a method in which a plasma of nitrogen or hydrogen is produced using an electrode including the catalyst element in a parallel plate type or positive columnar type plasma CVD apparatus, thereby, adding the catalyst element into an amorphous silicon film.

However, it is not desirable if the foregoing elements exist in a semiconductor too much because reliability or an electrical stability of a semiconductor device using such a semiconductor is hindered. Accordingly, the inventors have found that catalyst elements need to be used for crystallizing an amorphous silicon but it is desirable that a concentration of the catalyst elements in the crystallized silicon film be minimized. In order to achieve this object, it is desirable to use a catalyst element which is inactive in a crystalline silicon, and to accurately control the amount of the catalyst to be added into the silicon film in order to minimize the concentration of the catalyst element therein.

The crystallization process using a plasma treatment for adding nickel as a catalyst was studied in detail. The following findings were obtained as a result:

(1) In case of incorporating nickel by plasma treatment into an amorphous silicon film, nickel penetrates into the amorphous silicon film to a considerable depth before subjecting the film to a heat treatment;

(2) An initial nucleation occurs from the surface of the film in which nickel is added; and (3) When a nickel layer is formed on the amorphous silicon film by vapor deposition, the crystallization of an amorphous silicon film occurs in the same manner as in the case of effecting the plasma treatment.

In view of the foregoing, it is assumed that not all of the nickel introduced by the plasma treatment functions to promote the crystallization of silicon. That is, if a large amount of nickel is introduced, there exists an excess amount of the nickel which does not function for promoting the crystallization. For this reason, it is the point or the face of the silicon which contacts nickel that functions to promote the crystallization of the silicon at lower temperatures. Further, it is concluded that nickel has to be minutely dispersed in the silicon in the form of atoms. Namely, it is assumed that nickel needs to be dispersed in the vicinity of a surface of an amorphous silicon film in the form of atoms, and the concentration of the nickel should be as small as possible but within a range which is sufficiently high to promote the lower temperature crystallization.

A trace amount of a catalyst element capable of promoting the crystallization of silicon can be incorporated in the vicinity of a surface of an amorphous silicon film by, for example, vapor deposition. However, vapor deposition is disadvantageous concerning the controllability of the film, and is therefore not suitable for precisely controlling the amount of the catalyst element to be incorporated in the amorphous silicon film.

Next, with respect to a dispersion in a characteristics occurring in a laser crystallization, the inventors of the present invention found through experiments that this is caused by mainly the two reason, i.e. (1) a nonuniformity in a crystallinity due to a temperature distribution on a laser irradiated surface, and (2) the creation of crystal nuclei being contingent. Specifically, a laser beam generally has an intensity distribution in accordance with a gaussian distribution. The temperature of an amorphous silicon film is also in conformity with this distribution. As a result, during a crystallization of amorphous silicon through melting or partial melting, the crystallization must start at a region which has a lower temperature or a higher temperature dispersion than other regions because a crystallization occurs when a region from a melting condition to a solid phase. However, in practice, a crystal nuclei do not necessarily exist in such a region and therefore, there is a possibility that a supercooling region is formed. If such a supercooling region contacts crystal nuclei, a crystallization occurs explosively. Also, it is assumed that a uniform crystallization is difficult because the crystal nuclei tend to be formed at a surface roughness of an interface with a silicon oxide.

Accordingly, it is desired that a region at which temperature firstly becomes below a melting point among other regions is in conformity with a region in which crystal nuclei exist.

SUMMARY OF THE INVENTION

It is an object of the present invention to obtain a crystalline semiconductor film with a high uniformity. More specifically, in view of the foregoing circumstances, it is an object of the present invention to control the formation of crystal nuclei in a silicon film.

In accordance with one aspect of the present invention, crystal nuclei are introduced into at a predetermined region of an amorphous silicon film following which a laser crystallization is carried out. When the crystal nuclei have a higher transmission rate with respect to the laser light than the amorphous silicon and have a higher thermal conductivity, the temperature of the film becomes lower than the melting point first at the crystal nuclei and therefore the crystallization starts there and a uniform crystalline film can be obtained. As the crystal nuclei, it is desirable to use a material which allows an epitaxial growth of silicon, for example, minute crystallites of silicon, or nickel silicide which is formed by adding nickel to an amorphous silicon film and then heating it.

Furthermore, it is desirable to add crystal nuclei not uniformly within a silicon film but on an upper or lower surface of the film. The addition of the crystal nuclei onto the surface of the silicon film is appropriate because the crystallization proceeds sufficiently in a thickness direction of the film. Also, this is considered helpful for enlarging a size of each crystal.

Moreover, it is desirable to irradiate a laser light from the side of the silicon film on which the crystal nuclei are added. By doing so, it is possible to remarkably reduce a surface roughness after the laser irradiation as compared with the case in which only a laser irradiation is used without the formation of the crystal nuclei. The inventors of the present invention consider this is because the absorption efficiency of the laser light by the crystal nuclei (i.e. crystal silicon) is smaller than that by an amorphous silicon so that this portion does not melts easily. Surface roughness is comparable with that in the case of using only a solid phase growth. Generally, the surface roughness is detrimental for a semiconductor device such as a TFT, for example, it causes a scattering of carriers.

In accordance with one embodiment of the present invention, a method for manufacturing a semiconductor device comprises the steps of:
  forming an amorphous silicon film;
  introducing crystal nuclei to said amorphous silicon film; and
  growing crystals from said crystal nuclei, thereby obtaining a crystalline silicon film.

The crystal nuclei are formed by adding a catalyst including a catalyst element such as nickel onto a surface of the amorphous silicon film and then applying energy by heating or light irradiation (IR light irradiation). Further, the crystals grow from the introduced crystal nuclei by irradiating a laser light or a light equivalent to the laser light from the side on which the crystal nuclei are formed. The growth of the crystals is epitaxial.

As a method for adding a catalyst element, it is appropriate to coat an amorphous silicon film with a solution which contains the catalyst element therein. In particular, the catalyst element should be added by contacting the surface of the amorphous silicon film. This is important for accurately controlling the amount of the catalyst element to be incorporated into the film.

The catalyst element may be added either from an upper surface or a lower surface of the amorphous silicon film. In the former case, the solution should be applied onto an upper surface of an amorphous silicon film after the deposition thereof. In the latter case, the solution should be applied onto a base surface and then the amorphous silicon film should be formed thereon.

The crystalline silicon film in accordance with the present invention is suitable as an active region of a semiconductor device which has at least one electrical junction such as PN, PI, NI or the like. For example, thin film transistors, diodes, photosensors may be manufactured.

The present invention has the following advantages:
  (a) It is possible to accurately control and reduce the concentration of a catalyst element in the silicon film.
  (b) If the solution contacts a surface of an amorphous silicon film, the amount of the catalyst element to be incorporated into the silicon film is determined by the concentration of the catalyst element in the solution.
  (c) It is possible to introduce the catalyst element into the amorphous silicon film at a minimum density since the catalyst elements which are adsorbed by the surface of the amorphous silicon film function to promote the crystallization.
  (d) A crystalline silicon film having a good crystallinity can be obtained without a high temperature process.

The catalyst provided by the solution may be in the form of a compound or in the form of atoms. Also, it may be dissolved in the solution, alternatively, it may be dispersed in the solution.

In the case of using a polar solvent such as water, alcohol, acid or ammonium, it is possible to use the following compounds for adding nickel, namely, nickel bromide. nickel acetate, nickel oxalate, nickel carbonate, nickel chloride, nickel iodide, nickel nitrate, nickel sulfate, nickel formate, nickel acetyl acetonate, 4-cyclohexyl nickel butyric acid, nickel oxide and nickel hydroxide.

Also, benzene, toluene, xylene, carbon tetrachloride, chloroform or ether can be used as a non-polar solvent. Examples of nickel compounds suitable for a non-polar solvent are nickel acetyl acetonate and 2-ethyl hexanoic acid nickel.

Further, it is possible to add an interfacial active agent to a solution containing a catalytic element. By doing so, the solution can be adhered to and adsorbed by a surface at a higher efficiency. The interfacial active agent may be coated on the surface to be coated in advance of coating the solution.

Also, when using an elemental nickel (metal), it is necessary to use an acid to dissolve it.

In the foregoing examples, the nickel can be completely solved by the solvent. However, even if the nickel is not completely solved, it is possible to use a material such as an emulsion in which elemental nickel or nickel compound is dispersed uniformly in a dispersion medium. It is also possible to use a solution which is for forming a silicon oxide film. An example of such a solution is OCD (Ohka Diffusion Source) produced by Tokyo Ohka Kogyo Kabushiki Kaisha. A silicon oxide film may be easily formed by coating the OCD on a surface and then baking at about 200° C. It is also possible to add desired impurities to the silicon oxide film.

When using a polar solvent such as water for dissolving nickel, it is likely that an amorphous silicon film repels it. In such a case, a thin oxide film is preferably formed on the amorphous silicon film so that the solution can be provided thereon uniformly. The thickness of the oxide film is preferably 100 Å or less. Also, it is possible to add an interfacial active agent to the solution in order to increase a wetting property.

When using a non-polar solvent such as toluene for obtaining a solution of 2-ethyl hexanoic acid nickel, the solution can be directly formed on the surface of an amorphous silicon film. However, it is possible to interpose a material between the amorphous silicon film and the solution for increasing the adhesivity therebetween, for example, OAP (containing hexamethyl disilazane as a main component, produced by Tokyo Oka Kogyo) which is used to increase adhesivity of a resist.

The concentration of the catalyst element in the solution depends on the kind of the solution, however, roughly speaking, the concentration of the catalyst element such as nickel by weight in the solution should be 0.01–10 ppm, preferably, 0.01–1 ppm. The concentration is measured based on the nickel concentration in the silicon film after the completion of the crystallization.

After forming crystal nuclei by carrying out a heat treating on an amorphous silicon film which is added with a catalyst element, the silicon film can be uniformly crystallized into a crystalline silicon film by the use of a laser irradiation.

When a laser crystallization is carried out on an amorphous silicon film without crystal nuclei, the power of the laser necessary for the crystallization is much higher than the laser crystallization in which crystal nuclei are previously formed. Conventionally, it was known that a laser power necessary for crystallizing an amorphous silicon film having microcrystallites is higher than the laser power necessary for crystallizing an amorphous silicon film having no crystallinity (because the difference in absorption efficiency of a laser light by the silicon films). However, the present invention is entirely opposite to this since a lower laser power is sufficient for crystallizing a silicon film in which crystal nuclei are formed.

In the present invention, the region of the silicon film which become a crystal nucleus upon crystallization can be controlled by controlling the amount of the catalyst element incorporated into the film. The film can be regarded as in a state which is a mixture of a crystalline structure and an amorphous structure. Typically, a proportion of crystal components with respect to the entire plane of the film is from 0.01 to 20%. By the application of a laser light in this state, crystals can grow from the crystal nuclei which exist in the regions having crystallinity, and accordingly, it is possible to obtain a higher crystallinity. In other words, small crystallites are grown into large crystallites. For this reason, the crystal growth length, the size and number of crystallites, or the like can be controlled by controlling the amount of a catalyst element and the power of a laser light.

Instead of using a laser light, it is also possible to use an intense light, especially, an infrared light for crystallization. Since infrared ray is not so absorbed by a glass substrate, it is possible to heat only the silicon film. This irradiation is generally called as a rapid thermal annealing (RTA) or rapid thermal process (RTP).

In the present invention, nickel is disclosed as a most preferred catalyst element. However, it is to be understood that other catalyst elements may be used in a similar manner. Examples of such elements are Pd, Pt, Cu, Ag, Au, In, Sn, Pb, P, As and Sb. It is also possible to select one or more elements from the groups VIII, IIIb, IVb and Vb elements of the periodic table.

In place of using a solution such as water or alcohol, it is also possible to use other materials which contain a catalyst material, for example, metal compound or oxide.

PREFERRED EMBODIMENTS OF THE PRESENT MENTION

Embodiment 1

In this embodiment, a crystallization through a laser irradiation after a heat crystallization on a semiconductor film having been provided with an aqueous solution containing a catalyst will be discussed with reference to FIGS. 1A–1D.

It is desirable that a concentration of hydrogen contained in the amorphous silicon film before a laser crystallization be as small as possible, for example, 0.01 to 10 atm %. For this reason, it is preferable to heat the amorphous silicon film at a temperature which is lower than a crystallization temperature thereof in order to effuse hydrogen from the silicon film. In the alternative, it is possible to form an amorphous silicon film in which the concentration of hydrogen falls within the above range by LPCVD using $Si_2H_6$ (100–500 sccm) and He (500 sccm) at a relatively higher temperature for example 430 to 500° C.

Figure 1A:
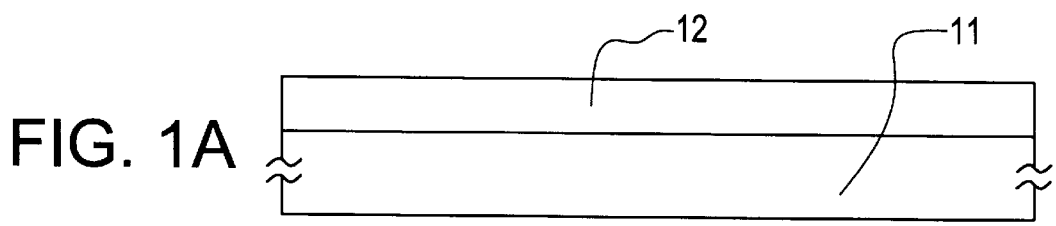
FIGS. 1A–1D show a manufacturing process in accordance with the present invention.
Figure 1B:
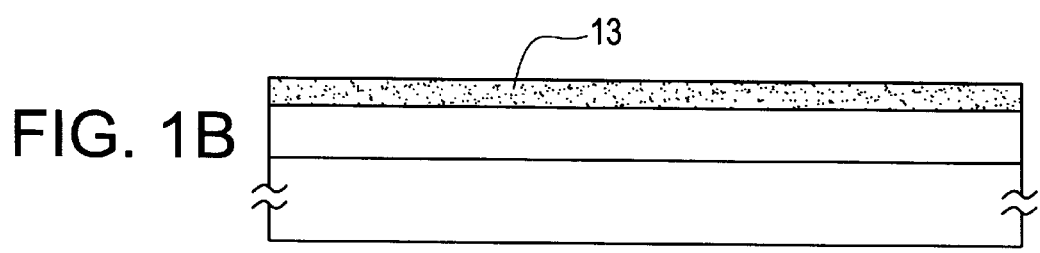
Figure 1C:
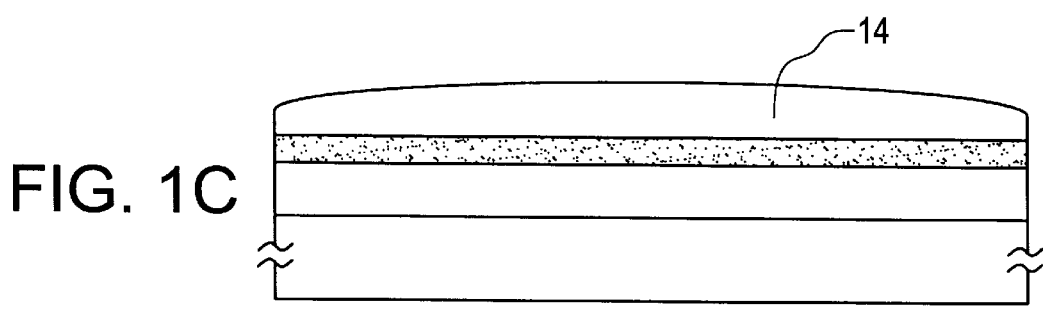
Figure 1D:
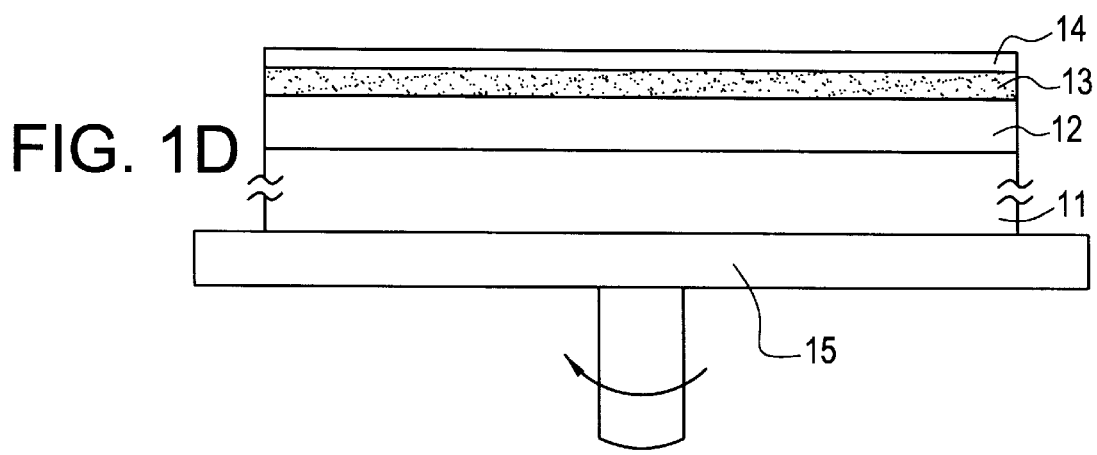

FIG. 1A, the reference numeral 11 shows a Corning 7059 glass substrate of 100 mm×100 mm. Initially, an amorphous silicon film 12 is deposited by a known plasma CVD or LPCVD to a thickness of 100–1500 Å on the substrate 11. For example, a plasma CVD is used and the thickness of the film is 1000 Å.

The thus formed amorphous silicon film is treated with a hydrofluoric acid solution in order to remove contaminants or natural oxide from the surface thereof, following which an oxide film 13 is formed to 10–50 Å. If it is possible to ignore the contaminants, a natural oxide may be used in place of the oxide film 13. The oxide film 13 should be very thin, for example, about 20 Å. The oxide film 13 is formed by an irradiation of UV light in an oxidizing atmosphere such as oxygen for about 5 minutes. Alternatively, the oxide film may be formed by a thermal oxidation or by treating it with a hydrogen peroxide. The oxide film 13 is for improving the wetting property of the surface, namely, a nickel acetate acid solution which will be used to add a catalyst element in a later step can be uniformly coated on the entire surface of the silicon film by the provision of the oxide film 13. If there is no oxide film on the amorphous silicon film, the acetate solution tends to be repelled by the amorphous silicon film so that it is not possible to add nickel uniformly and therefore, it is not possible to perform a uniform crystallization.

However, if a non-polar solvent such as a toluene solution of 2-ethyl hexanoic acid nickel is used, the oxide film 13 is unnecessary and the solution can be directly formed on the film 13.

Next, an acetate solution in which nickel is added is prepared. The concentration of nickel in the solution is 5 ppm. 2 ml of this solution is dropped onto a surface of the oxide film 13 formed on the silicon film 12. This condition is maintained for 1–5 minutes. Then, a spin dry is performed by using a spinner at 2000 rpm for 60 minutes. This coating step may be repeated plural times if desired. As a result, a layer 14 which contains nickel therein is formed on the amorphous silicon film 12 to a uniform thickness of several Å to several hundreds Å. The nickel in this layer will diffuse into the amorphous silicon film during a heat treatment and functions as a catalyst for promoting the crystallization. Also, this layer does not need to be a complete film, i.e. it may be a discontinuous film.

The amorphous silicon film is maintained for 1–5 minutes after applying the solution thereto. The concentration of nickel introduced into the silicon film may depend upon this period. However, the main factor for determining the concentration is the concentration of nickel contained in the solution.

Figure 2A:
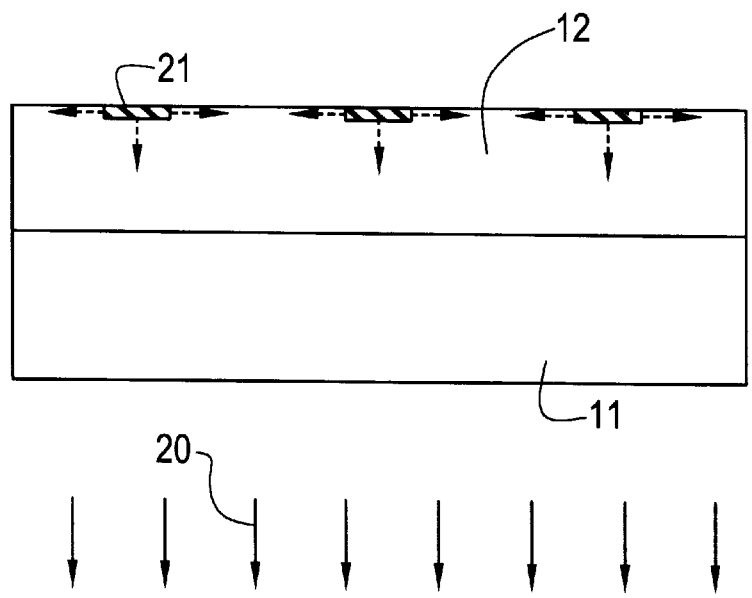
FIGS. 2A–2C show a manufacturing process in accordance with the present invention.

Next, the substrate is heat treated in a nitrogen atmosphere for 1 hour at 550° C. As a result of this step, crystallinity is partly produced in the silicon film 12, namely crystal nuclei are formed as shown in FIG. 2A. Reference numeral 21 shows crystal nuclei formed in the amorphous silicon film 12.

The temperature of the foregoing heat treatment should be not lower than 450° C. If the temperature is lower than 450° C., the duration of the heat treatment should be lengthened so that the productivity is lowered. Also, if the temperature is higher than 550° C., a heat resistance of the glass substrate becomes a problem.

It is to be understood that the nickel containing solution may be applied onto the substrate prior to forming the amorphous silicon film 13. In such a case, the crystal nuclei are introduced from the bottom surface of the amorphous silicon film.

Figure 2B:
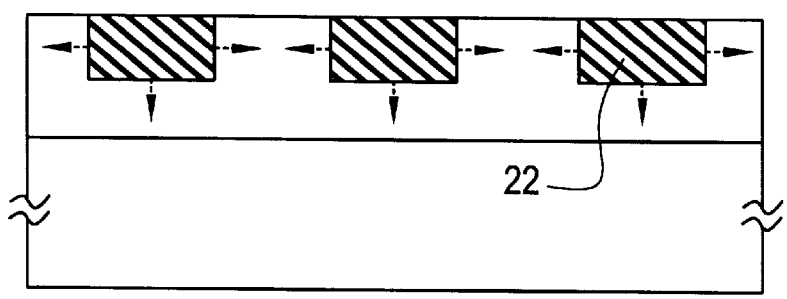
Figure 2C:
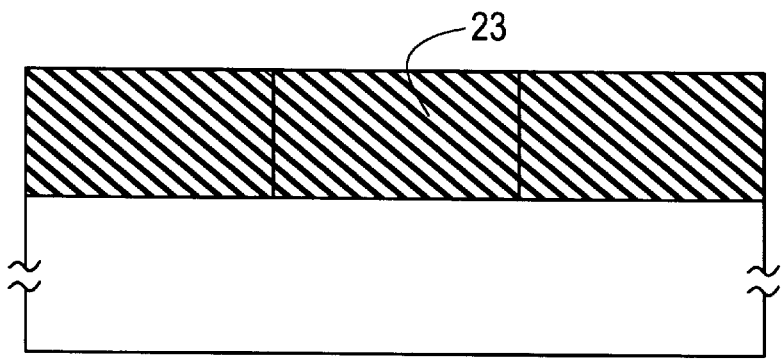
Figure 6:
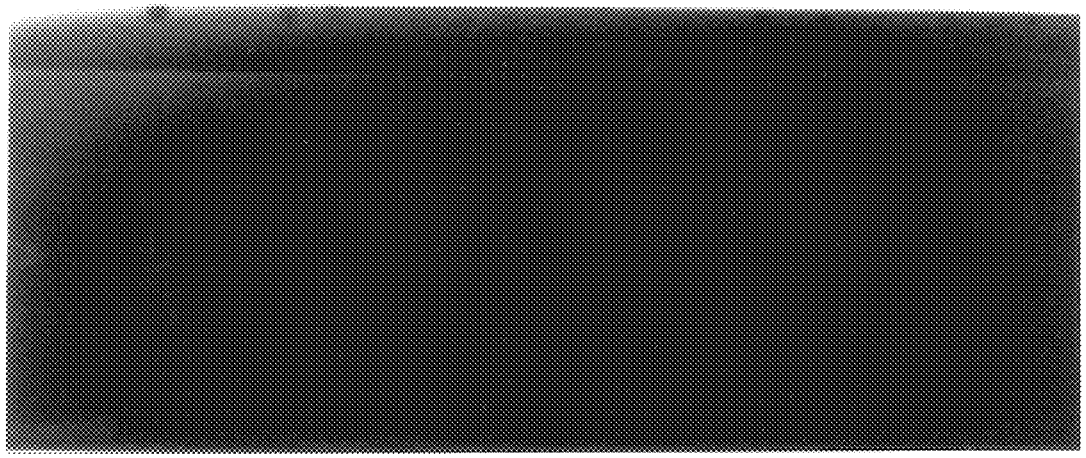
FIG. 6 is a photograph corresponding to the cross sectional view of FIG. 2A.

After the foregoing heat treatment, the silicon film 12 is completely crystallized by the irradiation of several shots of a KrF excimer laser 20 (wavelength 248 nm, pulse width 30 nsec) in a nitrogen atmosphere. The power density of the laser is 200–350 mJ/cm$^2$. In place of the laser, it is possible to use an infrared light. It is important in this invention that the laser light is emitted from the upper surface of the amorphous silicon film on which the crystal nuclei have been formed. FIGS. 2A to 2C show how the crystals grow from the crystal nuclei 21 by the laser irradiation. By this crystal growth, a polycrystalline film 23 is formed. FIG. 6 is a photograph which corresponds to FIG. 2A. Small crystals which are grown from the crystal nuclei can be observed from the photograph of FIG. 6. Although there is a silicon oxide film between the substrate and the silicon film, this can not be seen in FIG. 6.

Embodiment 2

This embodiment is entirely the same except that the concentration of nickel in the solution is changed to 1 ppm.

The silicon film after the heat treatment was observed by a microscope. As a result, it was found that a portion of amorphous silicon is increased as compared with the previous embodiment. Also, the number of crystal nuclei was reduced.

Further, after the laser crystallization, the sample was Secco-etched and observed by SEM. As a result, it was found that the size of each crystal was larger than that obtained in the previous embodiment.

Embodiment 3

This embodiment relates to a process for fabricating TFTs which are provided to each of the pixels of an active matrix liquid crystal display device or for a driver circuit, using a crystalline silicon film fabricated by the process according to the present invention. TFTs can be applied not only to liquid crystal display devices, but also to a wide field generally denoted as thin film integrated circuits (ICs).

Referring to FIGS. 3A to 3E, the process for fabricating a TFT according to the present embodiment will be described below. A silicon oxide film (not shown in the figure) is deposited to a thickness of 2,000 Å as a base coating on a glass substrate. This silicon oxide film is to prevent the diffusion of impurities into the device from the glass substrate.

An amorphous silicon film is deposited thereafter to a thickness of 500 Å in the same manner as in Embodiment 1. After removing a natural oxide film by a hydrofluoric acid treatment, a thin film of an oxide film is formed to a thickness of about 20 Å by means of UV irradiation in an oxygen atmosphere.

The resulting amorphous silicon film having the oxide film thereon is coated with an aqueous acetate solution containing nickel at a concentration of 10 ppm. The resulting structure is retained for a duration of 5 minutes, and is subjected thereafter to spin drying using a spinner. The silicon oxide film is removed thereafter using a buferred hydrofluoric acid, and a silicon film is partially crystallized by heating the resulting structure at 550° C. for a duration of 1 hour. Thus, a silicon film in which an amorphous components and crystalline components are mixed is obtained. The crystallized portions function as crystal nuclei.

Then, the silicon film is irradiated with a KrF excimer laser light from the upper surface of the silicon film at 200–300 mJ. During the laser irradiation, the substrate is heated at 400° C. Thus, crystals grow from the crystal nuclei which are formed in the former step.

Figure 3A:
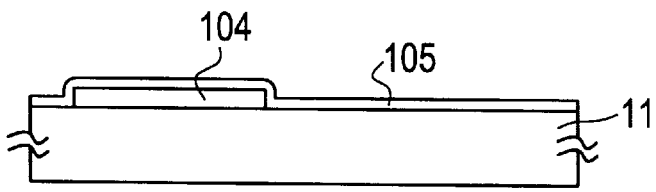
FIGS. 3A–3E show a manufacturing process of a TFT in accordance with Embodiment 3 of the present invention.
Figure 3B:
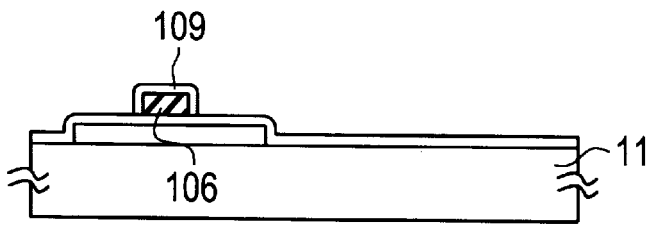

The silicon film thus crystallized is patterned to form an island-like region 104 as shown in FIG. 3A. The island-like region 104 functions as an active layer of the TFT. A silicon oxide film 105 is formed thereafter to a thickness of from 200 to 1,500 Å for example, 1,000 Å. The silicon oxide film functions as a gate insulating film.

The silicon oxide film 105 is deposited by means of RF plasma CVD process using TEOS (tetraethoxysilane). That is, TEOS is decomposed and then deposited together with oxygen at a substrate temperature of 150 to 600° C., preferably in the range of 300 to 450° C. TEOS and oxygen are introduced at a pressure ratio of 1:1 to 1:3 under a total pressure of 0.05 to 0.5 Torr, while applying an RF power of 100 to 250 W. Alternatively, the silicon oxide film can be fabricated by reduced pressure CVD or normal pressure CVD using TEOS as the starting gas together with gaseous ozone, while maintaining the substrate temperature in the range of from 350 to 600° C., preferably, in the range of from 400 to 550° C. The film thus deposited is annealed in oxygen or ozone in the temperature range from 400 to 600° C. for a duration of from 30 to 60 minutes.

A KrF excimer laser (operating at a wavelength of 248 nm with a pulse width of 20 nsec) or an intense light equivalent thereto may be irradiated in this condition in order to help the crystallization of the silicon island 104. In particular, an application of RTA (rapid thermal annealing) using infrared radiation is effective because the silicon film can be heated selectively without heating the glass substrate. Moreover, the RTA is especially useful in the fabrication of insulated gate field effect semiconductor devices because it decreases the interface level between the silicon layer and the silicon oxide film.

Subsequently, an aluminum film is deposited to a thickness of from 2,000 Å to 1 μm by electron beam vapor deposition, and is patterned to form a gate electrode 106. The aluminum film may contain scandium at 0.15 to 0.2 weight % as a dopant. The substrate is then immersed into an ethylene glycol solution of a tartaric acid at 1–3% with its pH controlled to about 7 to effect anodic oxidation using platinum as a cathode and the aluminum gate electrode as an anode. The anodic oxidation is effected by first increasing the voltage to 220 V at a constant rate, and then holding the voltage at 220 V for 1 hour to complete the oxidation. During the condition of applying a constant electric current, the voltage is preferably increased at a rate of from 2 to 5 V/minute. Thus, an anodic oxide 109 is formed to a thickness of from 1,500 to 3,500 Å, for example, 2,000 Å. (FIG. 6B).

Impurities (phosphorus) are implanted into the island-like silicon film of the TFT in a self-alignment manner by ion doping (plasma doping) using the gate electrode portion as a mask. Phosphine ($PH_3$) is used as a doping gas. The dose was from $1\times10^{15}$ to $4\times10^{15}$ $cm^{-2}$.

Figure 3C:
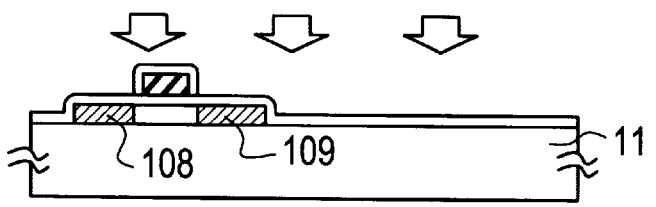

Thereafter, the crystallinity of the portion whose crystallinity is damaged by the introduction of impurities is cured by irradiating a KrF excimer laser (wavelength 248 nm, a pulse width of 20 nsec) as shown in FIG. 3C. The laser power density is from 150 to 400 $mJ/cm^2$, preferably, in a range of from 200 to 250 $mJ/cm^2$. As a result, N-type impurity (phosphorous) regions 108 and 109 are formed. The sheet resistance of the regions is found to be in the range of 200 to 800 $\Omega$/square.

This step of laser annealing can be replaced by an RTA process, i.e., a rapid thermal annealing process using a flash lamp in which the temperature of the silicon film is rapidly raised to a range of from 1,000 to 1,200° C. (as measured on the silicon monitor).

Figure 3D:
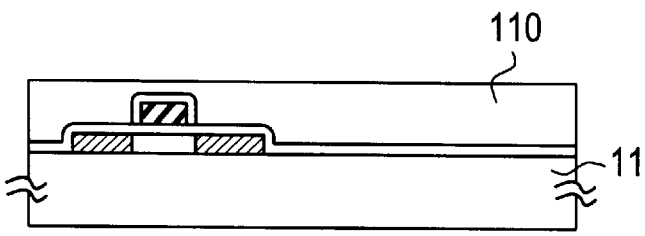

Next, a silicon oxide film is deposited to a thickness of 3,000 Å as an interlayer insulator 110 through a plasma CVD using TEOS together with oxygen, or through reduced pressure CVD or normal pressure CVD using TEOS together with ozone. The substrate temperature is maintained in the range of 250 to 450° C., for instance, at 350° C. A smooth surface is obtained thereafter by mechanically polishing the resulting silicon oxide film. (FIG. 3D).

Figure 3E:
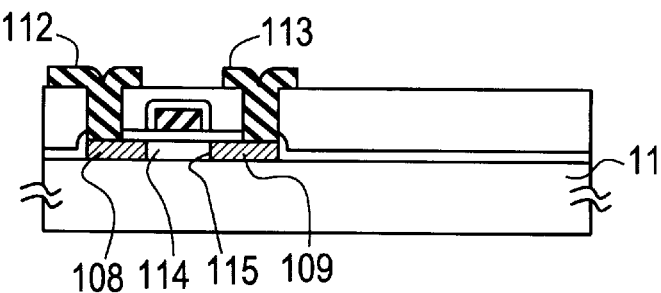

The interlayer dielectric 110 is etched to form contact holes on the source/drain as shown in FIG. 3E, and interconnections 112 and 113 are formed using chromium or titanium nitride.

In the case of a prior art method in which nickel is introduced by a plasma treatment, it is difficult to selectively etch only the silicon oxide film without etching the silicon film. However, in the present invention, nickel is incorporated into the silicon film by using an aqueous solution containing nickel at such a low concentration of 10 ppm. Accordingly, a silicon film having a high resistance against hydrofluoric acid can be formed and contact holes can be formed with high reproducibility.

Finally, the structure is annealed in hydrogen at a temperature of 300 to 400° C. for 0.1 to 2 hours in order to hydrogenize the silicon film. Thus, the fabrication of the TFT is finished, which has source drain regions 108 and 109 and a channel region 114, and an NI junction 115. A plurality of TFTs that are formed on the same substrate simultaneously in the foregoing process are arranged in a matrix to form an active matrix liquid crystal display device.

In accordance with the present example, the concentration of the nickel contained in the active layer is assumed to be $3\times10^{18}$ atoms/$cm^3$ or lower, for example, in the range of $1\times10^{16}$ to $3\times10^{18}$ atoms/$cm^3$.

The N-channel TFTs fabricated in this embodiment have a mobility of 200 $cm^2$/Vs or higher. Also, the threshold voltage of the TFTs is small. Further, it was confirmed that the variation in the mobility is within ±10%. It is assumed that this is because uniform crystals are formed by uniformly introducing crystal nuclei through heat treatment and then crystallizing by a laser irradiation. If only a laser irradiation is employed, an N channel TFT having a mobility as high as 150 $cm^2$/Vs can be easily obtained. However, in such a case, the uniformity is not so improved as in the present invention.

Embodiment 4

In this embodiment, crystal nuclei are introduced into an amorphous silicon film from the side of a substrate and then a laser light is irradiated also from the side of the substrate for crystallization.

The structure of the TFT to be fabricated in this embodiment may be the same as that disclosed in the previous embodiment. Since the substrate should transmit a laser light, a quartz substrate is used in the case of using a KrF excimer laser (wavelength 248 nm). However, when a XeF excimer laser of which wavelength is 353 nm or when other longer wavelength lasers are used, it is possible to use a glass substrate (Corning 7059).

Initially, a hydrofluoric acid treatment is carried out on the surface of a quartz substrate, following which the surface is exposed to a UV light in an oxidizing atmosphere for 20 minutes. Since the surface of the quartz substrate tends to be hydrophobic due to contaminants, it is desirable to carry out these steps in order to make the surface more hydrophilic and thereby a solution containing a catalyst can be formed more uniformly.

The surface of the substrate is then coated with an acetate acid solution containing nickel at a concentration of 10 ppm and is retained for a duration of 5 minutes, following which spin drying is done using a spinner. Thereafter, an amorphous silicon film having a thickness of 500 Å is formed by plasma CVD or low pressure thermal CVD.

Then, the silicon film is partly crystallized by a heat treatment at 550° C. for 1 hour in order to partly crystallize it. Thereby, crystal nuclei are formed on the lower surface (the surface which contacts the substrate). The crystal nuclei will function as crystal nuclei during the subsequent laser crystallization step. By this step, a silicon film in which amorphous components and crystal components are mixed is obtained.

Next, a KrF excimer laser is irradiated from the substrate side at 200 –300 mJ in order to obtain a crystalline silicon film. The substrate is heated at 400° C. by using an infrared lamp during the laser irradiation. By this step, crystal growth is performed with the crystal nuclei as nuclei.

The thus formed crystalline silicon film is processed in the same manner as in Embodiment 3 to manufacture a TFT. The electrical characteristics of the TFT manufactured in this embodiment is almost the same as that of the TFT obtained in Embodiment 3.

Comparative Example

Instead of the heat treatment for forming crystal nuclei as explained in Embodiments 3 and 4, the crystal nuclei are formed by an irradiation of an infrared light having a wavelength of 1.2 μm. As a light source, it is possible to use a halogen lamp. The intensity of the infrared light is controlled so that a temperature of a single crystalline silicon wafer which is a monitor is maintained within a range of 900 to 1200° C. More concretely, a thermocouple is embedded within a silicon wafer. The output of the thermocouple is monitored and fed back to the light source. The temperature is raised at a constant rate of 50–200° C./second. Also, the film is naturally cooled at 20–100° C./second. Since the silicon film is selectively heated with this infrared light irradiation, the damage to a glass substrate can be suppressed.

Embodiment 6

Figure 4A:
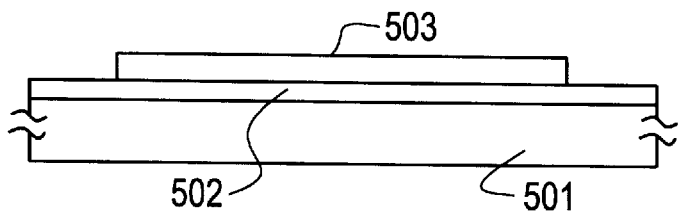
FIGS. 4A–4D show a manufacturing process of a TFT in accordance with Embodiment 6 of the present invention.

Referring first to FIG. 4A, a base film 502 of silicon oxide is formed on a Corning 7059 substrate 501 by sputtering to 2000 Å thick. The substrate is desirably annealed at a temperature higher than a distortion point of the substrate following which the glass is cooled to a temperature less than the distortion point at a rate of 0.1–1.0° C./minute. Thereby, it is possible to reduce a contraction of the substrate due to a substrate heating which occurs later (for example, thermal oxidation, thermal annealing), accordingly, a mask alignment process will be facilitated. This step may be performed either before or after the formation of the base film 502 or it may be done both before and after the formation thereof. In the case of using the Corning 7059 substrate, the substrate may be heated at 620–660° C. for 1–4 hours, following which it is cooled at a cooling rate of 0.1–0.3° C./minute and taken out from a furnace when the temperature decreases to 400–500° C.

Then, an intrinsic (I-type) amorphous silicon film is formed to 500–1500 Å thick, for example, 1000 Å through plasma CVD. The amorphous silicon film is provided with nickel as a catalyst for promoting a crystallization on its surface by the method described in Embodiment 1. Then, a heat treatment is performed at 550° C. for 1 hour in a nitrogen atmosphere (atmospheric pressure) in order to introduce crystal nuclei into the surface of the silicon film. Further, the film is crystallized by irradiating a KrF excimer laser. After the crystallization, the silicon film is patterned into an island form having a dimension of 10–1000 microns square. Accordingly, a crystalline silicon film 503 in the form of an island is formed as an active layer of a TFT as shown in FIG. 4A.

Figure 4B:
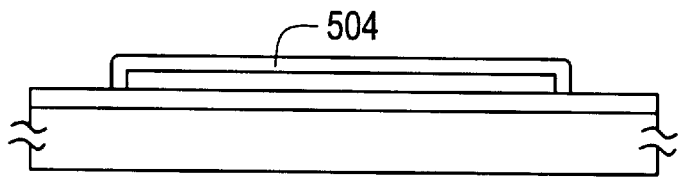

Referring to FIG. 4B, the surface of the silicon film is oxidized by exposing the surface to an oxidizing atmosphere to form an oxide film 504. The oxidizing atmosphere contains an aqueous vapor at 70–90%. The pressure and the temperature of the atmosphere is 1 atm and 500–750° C., typically 600° C. The atmosphere is produced by a pyrogenic reaction from oxygen and hydrogen gases with a hydrogen/oxygen ratio being 1.5 –1.9. The silicon film is exposed to the thus formed atmosphere for 3–5 hours. As a result, the oxide film 504 having a thickness of 500–1500 Å, for example, 1000 Å is formed. Since the surface of the silicon film is reduced (eaten) by 50 Å or more due to the oxidation, an influence of a contamination of the upper most surface of the silicon film does not extend to the silicon-silicon oxide interface. In other words, by the oxidation, it is possible to obtain a clean silicon-silicon oxide interface. Also, since the thickness of the silicon oxide film is two times as the thickness of the portion of the silicon film to be oxidized, when the silicon film is originally 1000 Å thick and the silicon oxide film obtained is 1000 Å, the thickness of the silicon film remaining after the oxidation is 500 Å.

Generally, the thinner a silicon oxide film (gate insulating film) and an active layer are, the higher a mobility is and the smaller an off current is. On the other hand, a preliminary crystallization of an amorphous silicon film is easier when its thickness is larger. Moreover, an amorphous component or grain boundaries contained in the crystalline silicon film tend to be oxidized during the thermal oxidation, resulting in a decrease in recombination centers contained in the active layer. Accordingly, the production yield can be improved.

After the formation of the silicon oxide film 504 through thermal oxidation, the substrate is annealed in a 100% monoxide dinitrogen atmosphere at 1 atm and 600° C. for 2 hours.

Figure 4C:
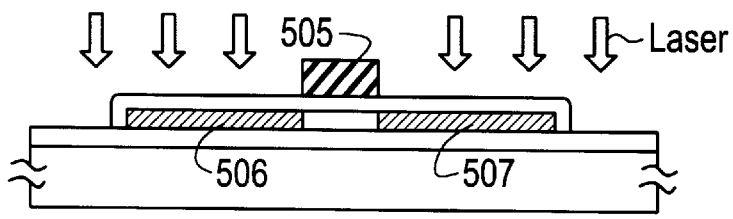

Referring to FIG. 4C, a polysilicon containing 0.01 to 0.2% phosphorous is deposited through low pressure CVD to 3000–8000 Å thick, for example, 6000 Å, and then patterned into a gate electrode 505. Further, using the gate electrode 505 as a mask, an N-type impurity is added into a portion of the active layer in a self-alignment manner by ion doping (also called as plasma doping). Phosphine is used as a dopant gas. The acceleration voltage is 60–90 kV, for example, 80 kV. Also, the dose amount is, for example, $5 \times 10^{15}$ cm$^{-2}$. Thus, N-type impurity regions 506 and 507 are formed.

Thereafter, an annealing is performed with a KrF excimer laser (wavelength 248 nm, pulse width 20 nsec). The energy density of the laser irradiation is 200–400 mJ/cm$^2$, for example, 250 mJ/cm$^2$. Also, the number of the shots of the laser light for one site is 2 to 10 shots, for example 2 shots. Further, the substrate may be heated at 200–450° C. during, the laser irradiation.

The laser annealing may be replaced by a lamp annealing with a near infrared ray. The near infrared ray is absorbed by crystalline silicon more effectively than by amorphous silicon. Accordingly, the annealing with the near infrared ray is comparable with a thermal annealing at 1000° C. or higher. On the other hand, it is possible to prevent the glass substrate from being detrimentally heated inasmuch as the near infrared ray is not so absorbed by the glass substrate. That is, although a far infrared ray can be absorbed by a glass substrate, visible or near infrared ray of which wavelength ranges from 0.5–4 μm are not so absorbed.

Figure 4D:
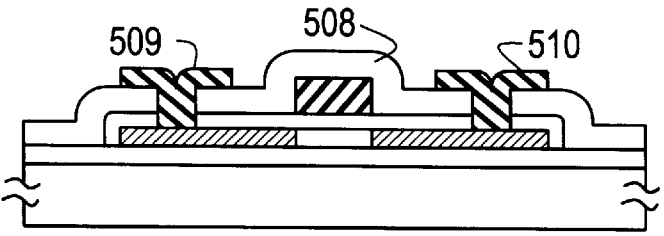
Figure 5:
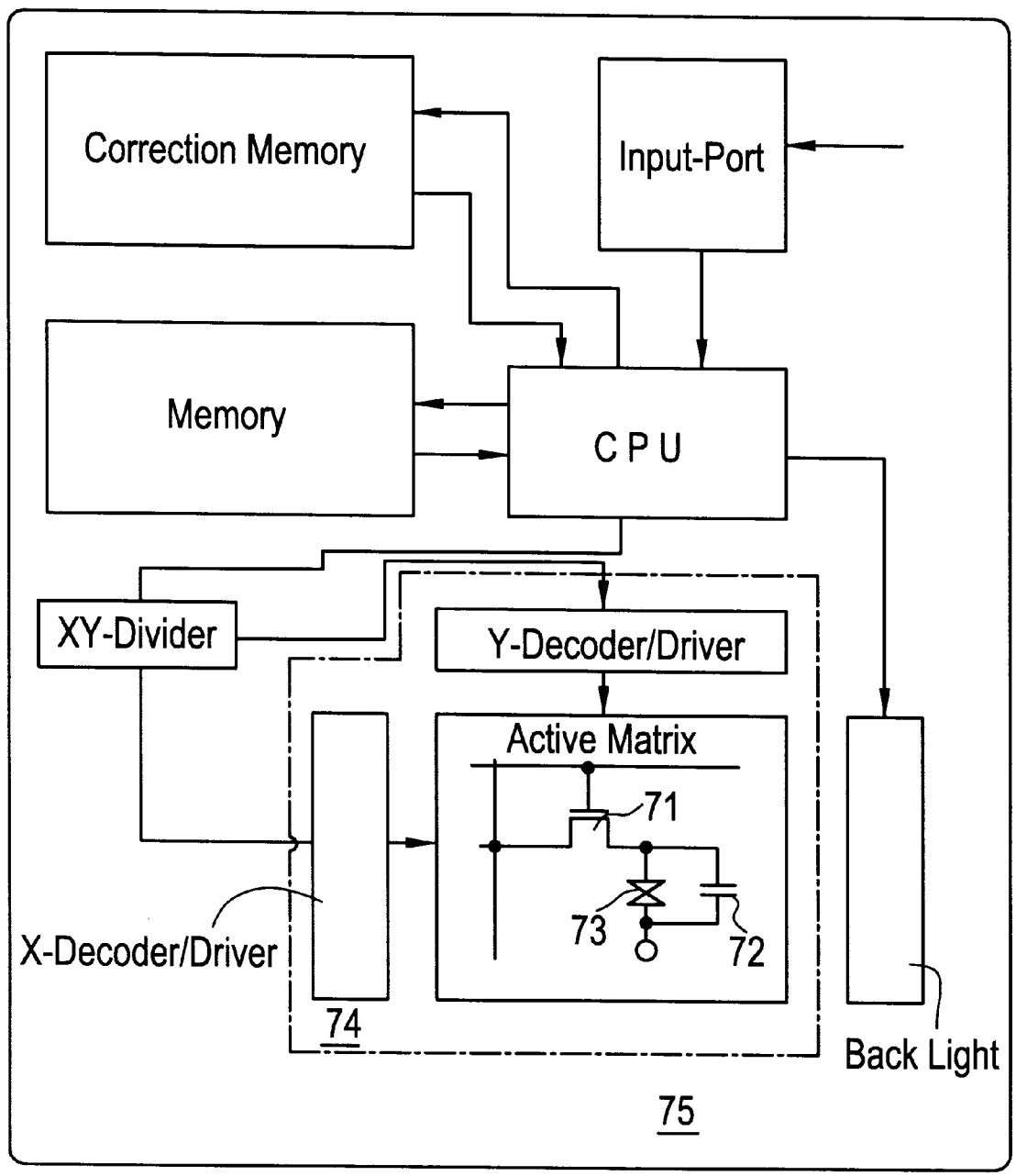
FIG. 5 is a block diagram showing an example of an active matrix liquid crystal device in accordance with the present invention.

Referring to FIG. 4D, an interlayer insulating film 508 of silicon oxide is formed to 6000 Å thick by a plasma CVD. A polyimide may be used instead of silicon oxide. Further, contact holes are formed through the insulating film. Electrode/wirings 509 and 510 are formed through the contact holes by using a multilayer of titanium nitride and aluminum films. Finally, an annealing in a hydrogen atmosphere is conducted at 350° C. and 1 atm for 30 minutes. Thus, a TFT is completed.

The mobility of the thus formed TFT is 110–150 cm$^2$/Vs. The S value is 0.2–0.5 V/digit. Also, in the case of forming a P-channel type TFT by doping boron into source and drain regions, the mobility is 90–120 cm$^2$/Vs and the S value is 0.4–0.6 V/digit. The mobility in accordance with the present example can be increased by 20% or more and the S value can be reduced by 20% or more as compared with a case where a gate insulating film is formed by a known PVD or CVD.

Also, the reliability of the TFT in accordance with the present example is comparable to that of a TFT which is produced through a thermal oxidation at a temperature as high as 1000° C.

Embodiment 7

This embodiment shows an example of an integrated electro-optical device (typically, a liquid crystal device) which has one glass substrate on which all of a display, CPU and a memory are integrally mounted. FIG. 6 shows a block diagram of such an electro-optical device having TFTs in accordance with the present invention.

In the diagram, the input port is to read a signal input from an outside and to convert it into a display signal. The correction memory which is peculiar to each panel is to correct the input signal or the like in accordance with a specific characteristics of an active matrix panel. Especially, the correction memory uses a non-volatile memory in which an information of each pixel is stored in order to perform the correction at each pixel. That is, if there is a defective pixel (point defect) in the electro-optical device, pixels surrounding the defective pixel are supplied with signals which are corrected in order to disappear or cover the defect pixel.

Also, when there is a pixel of which brightness is lower than others, the signal to be applied to that pixel is corrected to be a larger signal, thereby, the brightness of that pixel becomes the same as its surrounding pixels. Pixels are provided with a liquid crystal 73 and capacitor 72 and TFTs 71.

The CPU and the memory are equivalent to those used in a normal computer. Especially, the memory uses a RAM in which an image memory corresponding to each pixel is stored. Also, it has a function of changing an intensity of back light on the rear side of the substrate in response to the image information.

While the preferred embodiments of the present invention have been described, it is to be understood that many modifications may be made by those ordinary skilled in this art without departing the scope of the appended claims. For example, the catalyst is added onto an entire surface of an amorphous silicon film in the embodiments. However, it is possible to add the catalyst only a selected region of a semiconductor film so that a higher crystallinity TFT and a lower crystallinity TFT may be formed on one substrate or a higher crystallinity region and a lower crystallinity region may be formed within one TFT.

What is claimed is:

1. A method of manufacturing a semiconductor device, said method comprising the steps of:

forming a non-single crystalline semiconductor film comprising silicon on an insulating surface;

forming discrete silicon crystals within said semiconductor film by heating; and growing said discrete silicon crystals by irradiating with a light.

2. A method of manufacturing a semiconductor device, said method comprising the steps of:

forming a non-single crystalline semiconductor film comprising silicon on an insulating surface;

forming discrete silicon crystals within a portion of said semiconductor film by heating; and growing said discrete silicon crystals by irradiating with a light so that said portion of said semiconductor film is crystallized, wherein said portion of said semiconductor film includes an active region of said semiconductor device.

3. A method of manufacturing a semiconductor device, said method comprising the steps of:

forming a non-single crystalline semiconductor film comprising silicon on an insulating surface;

forming discrete silicon crystals in an upper portion of said semiconductor film by heating; and performing a crystallization of said semiconductor film by irradiating with a light so that said portion of said semiconductor film is crystallized, wherein said crystallization of said semiconductor film proceeds only from said discrete silicon crystals through said semiconductor film.

4. A method according to claim 1 wherein said light is a laser light.

5. A method according to claim 1 wherein said light is applied by a lamp.

6. A method according to claim 1, wherein said semiconductor device is a thin film integrated circuit.

7. A method according to claim 1 wherein said semiconductor film includes a catalyst element being capable of promoting crystallization of said semiconductor film at a concentration not higher than $3 \times 10^{18}$ cm$^{-3}$.

8. A method according to claim 2 wherein said light is a laser light.

9. A method according to claim 2, wherein said light is applied by a lamp.

10. A method according to claim 2 wherein said semiconductor device is a thin film integrated circuit.

11. A method according to claim 2 wherein said semiconductor film includes a catalyst element being capable of promoting said semiconductor film at a concentration not higher than $3 \times 10^{18}$ cm$^{-3}$.

12. A method according to claim 3 wherein said light is a laser light.

13. A method according to claim 3 wherein said light is applied by a lamp.

14. A method according to claim 3 wherein said semiconductor device is a thin film integrated circuit.

15. A method according to claim 3 wherein said semiconductor film includes a catalyst element being capable of promoting said semiconductor film at a concentration not higher than $3 \times 10^{18}$ cm$^{-3}$.

* * * * *